United States Patent [19]

Vollenweider

[11] 4,124,877

[45] Nov. 7, 1978

[54] AMPLIFIER WITH DIGITAL CONTROL

[75] Inventor: Max Vollenweider, Winterthur, Switzerland

[73] Assignee: Kistler Instrumente AG, Switzerland

[21] Appl. No.: 790,820

[22] Filed: Apr. 25, 1977

[30] Foreign Application Priority Data

Apr. 27, 1976 [CH] Switzerland ............... 005492/76

[51] Int. Cl.² .......................................... H05K 5/00
[52] U.S. Cl. ................................ 361/393; 361/395; 200/11 TW; 325/355; 330/65
[58] Field of Search ............. 200/11 TW; 339/17 M, 339/17 LM, 18 P, 193 P; 361/346, 348, 380, 392-395, 412, 415, 424; 325/355; 330/65

[56] References Cited

U.S. PATENT DOCUMENTS

| | | | |
|---|---|---|---|
| 2,902,630 | 9/1959 | Heazel, Jr. ...................... | 361/392 |
| 3,054,024 | 9/1962 | Van Diller .......................... | 361/392 |
| 3,089,923 | 5/1963 | Wright ............................. | 200/11 TW |
| 3,567,894 | 3/1971 | Spreitzer ......................... | 200/11 TW |
| 3,599,046 | 8/1971 | Speitzer ............................ | 361/394 |
| 3,927,925 | 12/1975 | Borsuk ............................ | 339/17 M |
| 3,987,344 | 10/1976 | Ambruoso, Sr. ................ | 339/17 M |

*Primary Examiner*—Gerald P. Tolin
*Attorney, Agent, or Firm*—Craig & Antonelli

[57] ABSTRACT

In electronic amplifiers it is desirable to have the capability of accurate setting of the characteristic values while still having a limited space on a front panel. In order to accomplish this, a digital switch having a plurality of digital switch units on a front portion is coupled to an amplifier assembly. The amplifier assembly is coupled to the back portion of the digital switch and has a configuration such that it can fit into the same opening in the panel as the digital switch alone. Thus, the entire electronic amplifier unit takes up no more frontal space on the panel than that necessary for mounting the digital switch alone.

7 Claims, 5 Drawing Figures

U.S. Patent    Nov. 7, 1978    4,124,877
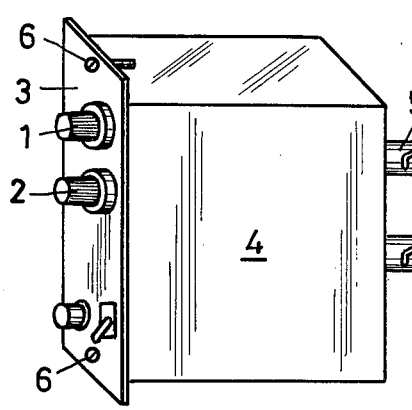
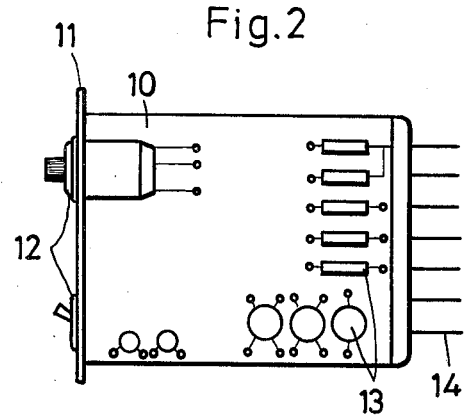
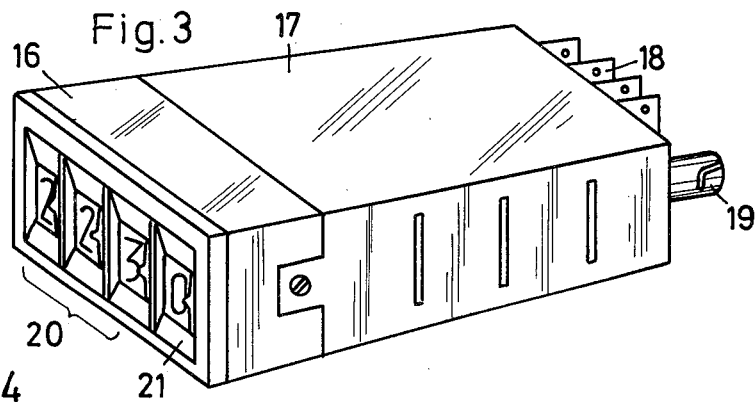
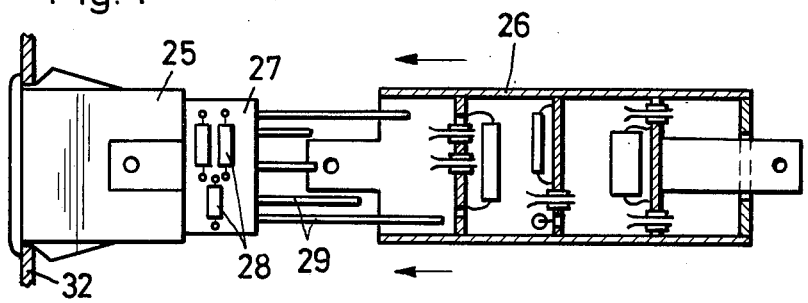
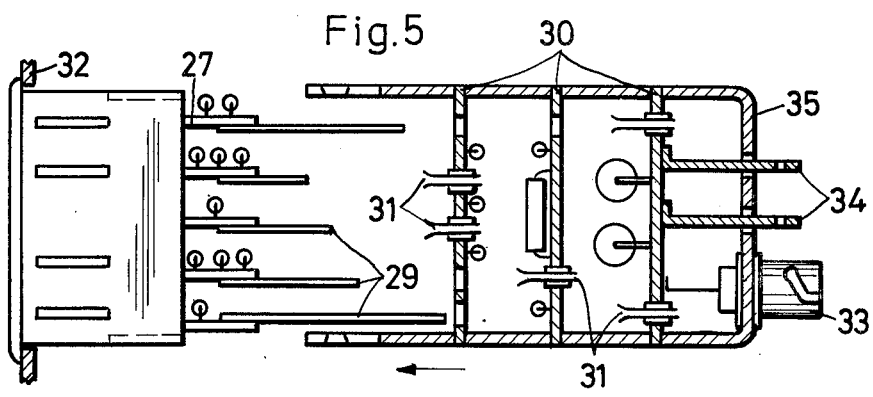

AMPLIFIER WITH DIGITAL CONTROL

FIELD OF THE INVENTION

This invention relates generally to amplifiers, and more particularly to electronic amplifiers having digital control.

BACKGROUND OF THE INVENTION

In metrology, electronic amplifiers are used for processing the generally weak signals of active and passive data pick-ups. The output values of such amplifiers are standardized and processed such that simple relationships between the input values of the data pick-ups and the output range of the amplifier are formed.

Depending on whether it is used in the laboratory or factory, different amplifier models have been introduced. In laboratory instruments, which must be as universal as possible, the setting knobs for adapting the output values of the amplifier to the data of the data pick-up are located on a front panel. The amplifier box in which the electronics are located is attached to this front panel.

For industrial applications, the electronics are generally located on a standardised plug-in board, on which the setting data sent to the data pick-ups are generally set by means of potentiometers. However, in many cases, analog values can also be set for signal adaptation on the narrow front panels. However, for the users, such printed circuit amplifiers, as they are known in the trade, are doubtless space saving but often impractical to set.

SUMMARY OF THE INVENTION

According to the invention, these difficulties are removed with a new type of electronic amplifier, in particular for industrial use. It is characterized by a combination unit made up of a commercially available digital switch with a miniaturized electronic amplifier in such a way that the unit can be mounted in the same way as the digital switch alone.

BRIEF DESCRIPTION OF THE DRAWINGS

The invention will be described in detail with reference to the following five figures.

FIG. 1 shows a commercially available prior art amplifier mainly for use in the laboratory.

FIG. 2 shows a commercially available prior art plug-in board amplifier mainly for industrial use, FIG. 3 shows one of the possible embodiments of the amplifier according to the invention, with digital setting, in elevation.

FIG. 4 shows the telescopic parts of an amplifier according to the invention according to FIG. 3 in vertical section, FIG. 5 shows the same parts as FIG. 4 in horizontal section.

DETAILED DESCRIPTION

The laboratory amplifier according to FIG. 1 shows the setting members 1, 2, normally a rotary potentiometer, rotary switch and tumbler switch located on the front panel 3, which is mounted on the frame by means of screws 6. Located in the box 4 are the electronics, which are connected to the setting members 1, 2, likewise to the input and output bushes 5, 7.

In place of the box 4, the industrial amplifier according to FIG. 2 uses only the printed circuit board 10, whose dimensions are standardized and on whose surface the electronic components 13 are mounted according to known methods. Input and output values are transmitted by multiple contact plugs 14. In certain cases, the board 10 is provided with a narrow front panel 11, on which setting members 12 such as a potentiometer for example are located.

In the amplifier arrangement according to the invention, shown in FIG. 3, the setting members 20, 21 are combined in a commercially available digital switch 16 and the amplifier elements are assembled to form an amplifier 17 such that this amplifier 17 can be attached to the commercially available digital switch 16 in the simplest manner, that, with the removal of actual wiring, an amplifier unit 22 is produced whose characteristic values can be set by means of the digital switch 16 and whose mounting, for example in the front panel of an instrument, takes place in the same manner as the mounting of the digital switch alone. The digital switch 16 may thus be selected such that one, two or more characteristic values of the amplifier 17 may be changed with the setting members 20, 21, one or more planes of the digital switch 16 being associated with each characteristic value. The advantages of this arrangement are obvious: in place of the setting switch necessary in each case for setting the characteristic values, while retaining the same type of assembly, the amplifier unit 22 is mounted directly with digital setting.

FIGS. 4 and 5 show the parts 16 and 17 of the digital amplifier unit 22 according to the invention which can be slid into each other. The commercially available digital switch 16 is provided with printed circuit boards 27, on which matching components 28 can be mounted. These printed circuit boards are provided with contact pins 29 of different lengths, which make contact after being pushed into the bushes 31 of the amplifier part 17. The amplifier part 17 consists of a number of printed circuit boards 30 arranged transversely, on which the electronic components are mounted. The input bush 33 and output terminals 34 project from the rear wall 35. They could also be formed as a plug-in arrangement 14, as shown in FIG. 2.

After assembling and screwing the two parts 16 and 17, an amplifier unit 22 is produced which can be inserted in the standard opening of the commercially available digital switch 16 and can thus be mounted in the simplest manner in a front panel 32, which may also be a control panel.

If the construction of the digital switch 16 is such that it is inserted from the front through a mounting aperture in the front panel 32, then the amplifier 17 should have the same mounting cross section as the switch 16, at the most. However, if the latter is constructed such that it is mounted in the front panel from behind, the amplifier is not subject to this restriction.

The amplifier according to the invention may thus be fitted subsequently in a very simple manner in existing control panels of control or monitoring equipment, without disturbing the front surface of the latter or taking up too much space. In contrast to all other arrangements, its space requirement on a control panel is reduced to the minimum operating requirement.

The new plug-in connection between the digital setting members 16 and amplifier part 17 according to the invention gives a simple, reliable, inexpensive and easily maintained unit, which facilitates substantially simplified assembly, easy operation and space-saving arrangement, due to which considerable technical improvements are possible. The coding of the data obtained on the measured value pick-ups may be carried out in simple manner in groups of digits, whereby only one digital switch is necessary for several setting values. Thus, the invention also provides a simplification in regard to operating technique.

I claim:

1. An electronic amplifier unit for mounting in a limited frontal space on a panel comprising:
   a digital switch having a frontal portion containing a plurality of individual digital switching units and a back portion, said digital switch having a cross-sectional configuration conforming to an opening in the panel to allow mounting the digital switch in the panel with the plurality of individual switching units facing outward from the panel; and
   an amplifier assembly coupled to the back portion of the digital switch to form an electronic amplifier unit wherein the characteristic values of said electronic amplifier unit are set by said digital switch, and further wherein said amplifier unit has a cross-sectional configuration which also conforms to the opening in the panel so that the electronic amplifier unit can be mounted in the same opening in the panel as the digital switch alone thereby reducing the frontal space requirement of the electronic amplifier unit to the minimum necessary for mounting the digital switch.

2. The electronic amplifier unit of claim 1, wherein the digital switch includes a plurality of printed circuit boards each of which is coupled to one or more connecting pins which extend from the back portion of the digital switch, and the amplifier assembly includes a plurality of printed circuit boards each of which contains one or more contact bushes for receiving the connecting pins from the digital switch thereby coupling the digital switch printed circuit boards to the amplifier assembly printed circuit boards.

3. The electronic amplifier unit of claim 2, wherein the contacting pins are of different lengths and the amplifier assembly printed circuit boards are spaced at different distances away from the back of the digital switch with one or more of the amplifier assembly printed circuit boards containing openings so that contacting pins can extend through the opening in one amplifier assembly printed circuit board without making contact with said one amplifier assembly printed circuit board and into the contact bushes of another amplifier assembly printed circuit board.

4. The electronic amplifier unit of claim 1, wherein the cross-sectional area of the amplifier part is less than the area of the mounting opening in the panel needed for the digital switch alone.

5. The electronic amplifier unit of claim 1, wherein the electronic amplifier unit is mounted in the same manner and with the same securing means into the opening in the panel as the digital switch alone would be mounted.

6. The amplifier according to claim 1, characterized in that the digital switch units used for setting the characteristic amplifier values are arranged in a plurality of groups with each group comprising one or more digital switching units.

7. The electronic amplifier unit of claim 1, wherein the amplifier assembly comprises a charge amplifier.

* * * * *